(12) United States Patent
Therrien et al.

(10) Patent No.: US 8,343,856 B2
(45) Date of Patent: Jan. 1, 2013

(54) METHOD FOR FORMING GALLIUM NITRIDE DEVICES WITH CONDUCTIVE REGIONS

(75) Inventors: Robert J. Therrien, Apex, NC (US); Jerry W. Johnson, Raleigh, NC (US); Allen W. Hanson, Cary, NC (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/303,075

(22) Filed: Nov. 22, 2011

(65) Prior Publication Data
US 2012/0070967 A1 Mar. 22, 2012

Related U.S. Application Data

(60) Division of application No. 12/508,891, filed on Jul. 24, 2009, now Pat. No. 8,067,786, which is a continuation of application No. 11/634,332, filed on Dec. 4, 2006, now Pat. No. 7,566,913.

(60) Provisional application No. 60/741,609, filed on Dec. 2, 2005.

(51) Int. Cl.
*H01L 21/20* (2006.01)
*H01L 21/36* (2006.01)

(52) U.S. Cl. ........ 438/479; 438/285; 438/478; 257/103; 257/191

(58) Field of Classification Search ................... 438/285, 438/478, 479; 257/103, 191–194, E29.089
See application file for complete search history.

(56) References Cited

U.S. PATENT DOCUMENTS

| 5,912,066 A * | 6/1999 | Takahashi ................... 428/195.1 |
| 6,657,237 B2 * | 12/2003 | Kwak et al. ...................... 257/99 |
| 7,233,028 B2 * | 6/2007 | Weeks et al. ..................... 257/98 |

* cited by examiner

*Primary Examiner* — Phuc Dang
(74) *Attorney, Agent, or Firm* — Farjami & Farjami LLP

(57) ABSTRACT

Semiconductor structures comprising a III-nitride (e.g., gallium nitride) material region and methods associated with such structures are provided. In some embodiments, the structures include an electrically conductive material (e.g., gold) separated from certain other region(s) of the structure (e.g., a silicon substrate) by a barrier material in order to limit, or prevent, undesirable reactions between the electrically conductive material and the other component(s) which can impair device performance. In certain embodiments, the electrically conductive material may be formed in a via. For example, the via can extend from a topside of the device to a backside so that the electrically conductive material connects a topside contact to a backside contact. The structures described herein may form the basis of a number of semiconductor devices including transistors (e.g., FET), Schottky diodes, light-emitting diodes and laser diodes, amongst others.

20 Claims, 2 Drawing Sheets

METHOD FOR FORMING GALLIUM NITRIDE DEVICES WITH CONDUCTIVE REGIONS

This is a divisional of application Ser. No. 12/508,891 filed Jul. 24, 2009 now U.S. Pat. No. 8,067,786.

RELATED APPLICATIONS

This application is a continuation of U.S. patent application Ser. No. 11/634,332, filed Dec. 4, 2006, now U.S. Pat. No. 7,566,913, which claims priority to U.S. Provisional Patent Application Ser. No. 60/741,609, filed Dec. 2, 2005, which are incorporated herein by reference.

FIELD OF INVENTION

The invention relates generally to gallium nitride material devices and, more particularly, to gallium nitride material devices including conductive regions, as well as devices and methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many microelectronic applications such as transistors, field emitters, and optoelectronic devices.

SUMMARY OF INVENTION

Gallium nitride material structures are provided, as well as devices and methods associated with such structures.

In one aspect, a gallium nitride material semiconductor device structure is provided. The device structure comprises a substrate; a gallium nitride material region formed on the substrate; a first contact formed on the gallium nitride material region; an electrically conductive material layer formed over, at least a portion of, the substrate; and a barrier material layer separating the electrically conductive material layer from the substrate.

In another aspect, a gallium nitride material semiconductor device structure is provided. The device structure comprises a substrate including a top surface and a back surface; a gallium nitride material region formed on the front surface of the substrate; a first metal region formed on the gallium nitride material region; a second metal region formed on the back surface of the substrate; a barrier material formed on, at least a portion, of a sidewall of a via extending through the gallium nitride material region and the substrate; and an electrically conductive material formed on the barrier material in the via extending from the first metal region to the second metal region.

In another aspect, a gallium nitride material semiconductor device structure is provided. The device structure comprises a semiconductor structure comprising a substrate including a top surface and a back surface; a gallium nitride material region formed on the top surface of the substrate; a source electrode formed on the gallium nitride material region; a gate electrode formed on the gallium nitride material region; a drain electrode formed on the gallium nitride material region; a pathway of electrically conductive material extending from the source electrode to a conductive region formed on a back surface of the substrate.

In another aspect, a gallium nitride material semiconductor device structure is provided. The device structure comprises a silicon substrate including a top surface and a back surface; a gallium nitride material region formed over the top surface of the silicon substrate; a component bonded to the back surface of the substrate with a eutectic comprising an electrically conductive material and silicon, wherein a via extends from the back surface of the silicon substrate.

In another aspect, a method of forming a semiconductor device structure is provided. The method comprises forming a gallium nitride material region on a front surface of a substrate; forming a first metal region on the gallium nitride material region; forming a second metal region on a back surface of the substrate; forming a via extending through the gallium nitride material region and the substrate; forming a barrier material on, at least a portion of, a sidewall of the via; and forming an electrically conductive material the barrier material in the via extending from the first metal region to the second metal region.

In another aspect, a method of forming a semiconductor device structure is provided. The method comprises forming a gallium nitride material layer on a silicon substrate; forming a via that extends through at least a portion of the silicon substrate; forming a layer comprising an electrically conductive material on a back surface of the silicon substrate to form a semiconductor structure; and heating the structure to form a liquid eutectic comprising the electrically conductive material and silicon; and cooling the liquid eutectic to form a bond between the semiconductor structure and a component.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention relates to semiconductor device structures comprising a III-nitride (e.g., gallium nitride) material region and methods associated with such structures. In some embodiments, the structures include an electrically conductive material (e.g., gold) separated from certain other region(s) of the structure (e.g., a silicon substrate) by a barrier material in order to limit, or prevent, undesirable reactions between the electrically conductive material and the other component(s) which can impair device performance. For example, the barrier material may limit, or prevent, undesirable reactions between a gold layer and a silicon substrate. In certain embodiments, the electrically conductive material may be formed in a via. For example, the via can extend from a topside of the device to a backside so that the electrically conductive material connects a topside contact to a backside contact. The structures described herein may form the basis of a number of semiconductor devices including transistors (e.g., FET), Schottky diodes, light-emitting diodes and laser diodes, amongst others.

Figure 1:
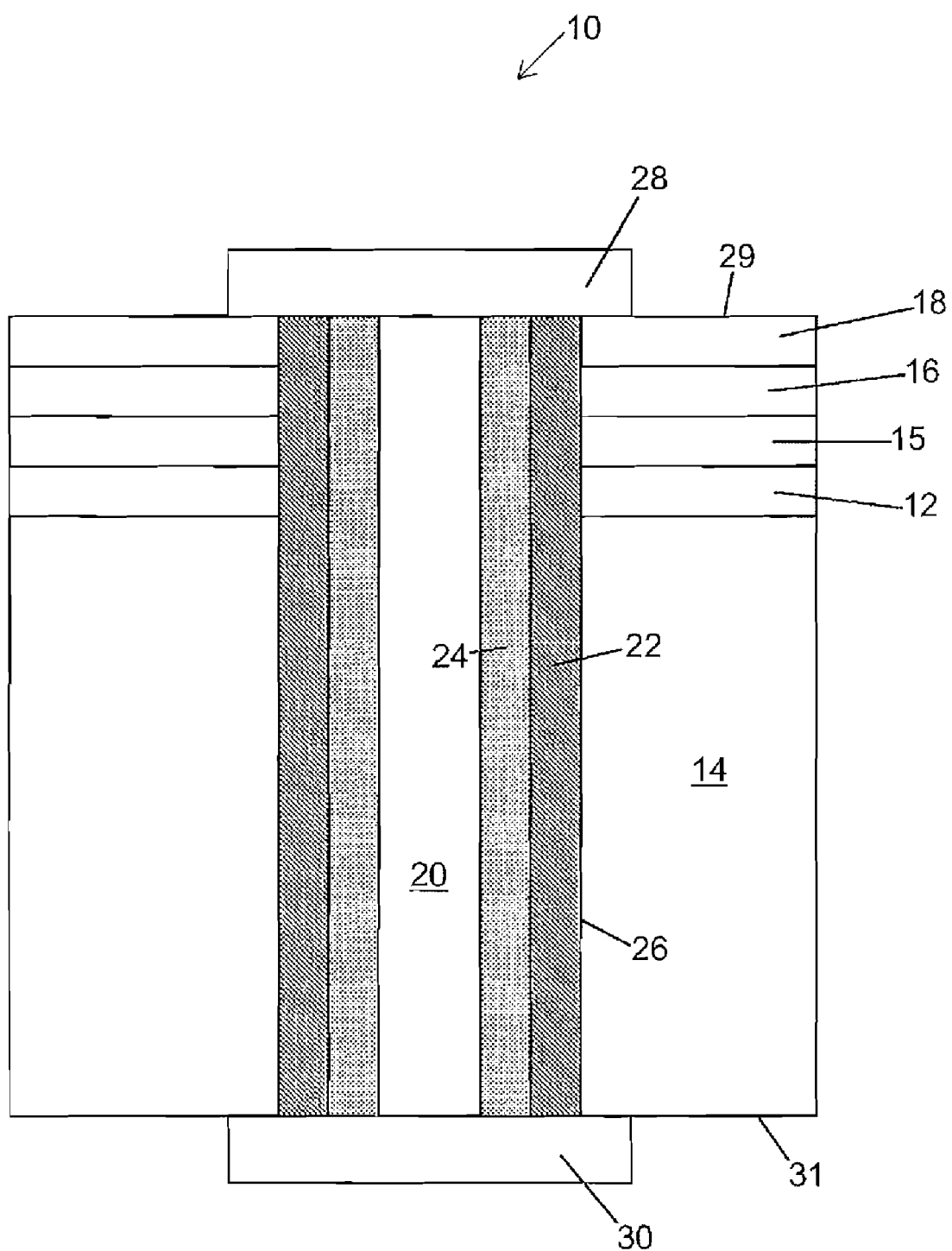
FIG. 1 illustrates a gallium nitride material-based device structure according to an embodiment of the present invention.

FIG. 1 illustrates a semiconductor structure 10 including a gallium nitride material region 18 formed over a substrate 14 according to one embodiment of the invention. In this embodiment, the structure includes an electrically conductive material layer 24 formed in a via 20. The electrically conductive material layer provides a conductive pathway associated with the structure. For example, the electrically conductive material layer can connect a contact 28 on a topside 29 of the structure to a contact 30 on a backside 31, as shown. A barrier material layer 22 is formed on sidewalls 26 of the via to separate the electrically conductive material from the substrate thereby limiting undesirable reactions between the electrically conductive material and the substrate which may otherwise occur, for example, at elevated temperatures in subsequent processes. As described further below, the structure includes an arrangement of layers between substrate 14 (e.g., a silicon substrate) and the gallium nitride material region 18 which may promote formation of high quality gallium nitride material. The arrangement in this embodiment includes a strain-absorbing layer 12, an intermediate layer 15, and a transition layer 16.

When a layer is referred to as being "on", "over" or "overlying" another feature (e.g., layer or substrate), it can be directly on the feature, or an intervening layer also may be present. A layer that is "directly on" another layer or substrate means that no intervening layer is present. It should also be understood that when a layer is referred to as being "on", "over" or "overlying" another feature (e.g., layer or substrate), it may cover the entire feature, or a portion of the feature.

It should be understood that not all of the features (e.g., layers) shown in FIG. 1 are present in all embodiments of the invention and that the illustrated features may be otherwise positioned within the structure. Also, additional features may be present in other embodiments. Additional embodiments are shown in the other figures and/or described further below.

Electrically conductive material layer 24 may formed of any material having suitable electrical conductivity. In certain embodiments, it may be preferable for the electrically conductive material layer to comprise gold. When comprised of gold, the electrically conductive material layer may also comprise other elements such as metals (e.g., copper). The other element(s) may be alloyed with gold to form a layer having a single composition. Also, the other element(s) may be present in a separate layer formed on top of a gold layer, both of which are combined to form the electrically conductive material layer. That is, the electrically conductive material layer can be formed of two (or more) conductive layers having different compositions; or, may be formed of a layer having a single composition. In cases where other metal elements are present in the layer, gold may be the major component of the layer (e.g., greater than 50% by weight, greater than 75% by weight, or greater the 90% by weight). Other suitable metal elements include titanium, tin, nickel, aluminum, and copper, amongst others. Any alloy combinations of these metals (including gold) may be suitable. In certain embodiments, the layer may consist essentially of gold, meaning that other elements are present (if at all) in amounts that do not materially effect the properties of the layer. As described further below, it may be advantageous for the electrically conductive material layer to be formed of a similar composition as that of one or more electrical contacts (e.g., topside contact 28, backside contact 30) to which the electrically conductive material layer is connected.

The electrically conductive material layer is generally sufficiently thick to ensure suitable conduction. For example, the electrically conductive material layer may have a thickness between about 100 nm and about 10 micron, though it should be understood that other thicknesses are also possible. Different portions of the layer may have different thicknesses.

In the embodiment of FIG. 1, the electrically conductive material layer is formed on sidewalls of the via (with the barrier material layer functioning as an intervening layer between the electrically conductive material layer and the sidewall, as described further below). The electrically conductive material layer may be deposited using known techniques including sputtering, evaporative and plating techniques. As shown, the electrically conductive material layer covers substantially the entire surface area of the via sidewalls. In other embodiments, the electrically conductive material layer may cover only a portion of the surface area of the via sidewalls (e.g., greater than 50 percent or greater than 75 percent of the sidewall surface area). In some embodiments, the electrically conductive material layer further extends from the via sidewall onto other portions of the structure. For example, the electrically conductive material layer may extend onto topside 29 and/or backside 31. In embodiments in which the electrically conductive material layer extends on to topside 29 and/or backside 31, the electrically conductive material may also form topside contact 28 and/or backside contact 30.

It should be understood that the electrically conductive material layer need not be formed in a via and that certain structures of the invention do not include a via. For example, the electrically conductive material may be formed as a layer on another layer.

In FIG. 1, barrier material layer 22 is positioned so as to separate the electrically conductive material from certain other regions of the structure. The barrier material layer generally is formed of material suitable for preventing undesired reactions (e.g., chemical reactions) between the electrically conductive material and other regions of the structure. For example, the barrier material may prevent undesired chemical reaction between the electrically conductive material and the substrate, particularly when the electrically conductive material is formed of gold and the substrate is a silicon substrate. It should also be understood that the barrier material may also provide other functions such as electrically isolating the electrically conductive material from other regions of the structure. When providing electrical isolation, the barrier material is suitably insulating. In other cases, the barrier material may also be formed of an electrically conductive material and, at least part of, the barrier material layer may form part of a conductive pathway with the electrically conductive material layer 24.

Suitable compositions for the barrier layer may include one or more of the following metals titanium, tungsten, nickel and platinum. When the barrier layer comprises more than one metal, the metals may be alloyed to form a single composition; or, may be formed as a series of layers having different compositions which combine to form the barrier layer. In some embodiments, it may be preferred that the barrier layer comprises a titanium-tungsten alloy. When electrically insulating, the barrier material may be formed of silicon oxide or silicon nitride, amongst other insulators.

In the illustrative embodiment, the barrier material layer is formed across the entire area between the substrate and the electrically conductive material layer. That is, the barrier material layer separates the substrate (e.g., silicon substrate) and the electrically conductive material layer at all locations with the barrier material layer being directly on the sidewalls of the via and the electrically conductive material layer being directly on the barrier material layer. This arrangement may be preferred to prevent/limit interaction between the substrate and the electrically conductive material.

In FIG. 1, the barrier material layer also separates the electrically conductive material layer from other regions of the structure including gallium nitride material region 18, as well as strain-absorbing layer 12, intermediate layer 15, and transition layer 16. However, it should be understood that in other embodiments the barrier material layer may not separate the electrically conductive material layer from certain regions of the structure including gallium nitride material region, the strain-absorbing layer, intermediate layer, or transition layer—particularly, if undesired reactions do not take place between the electrically conductive material layer and such regions.

The structure of FIG. 1 includes a topside contact 28 and a backside contact 30. A contact includes any suitable conducting structure on a semiconductor device that is designed to be electrically connected to a power source. "Contacts" may also be referred to as electrical contacts, electrodes, terminals, contact pads, contact areas, contact regions and the like. In some embodiments, contacts may be directly connected to a power source, for example, by wire bonding or air bridging. In other embodiments, a contact may be indirectly connected to a power source, for example, by a conductive pathway which connects to another contact and then to the power source.

Contacts are formed of conducting materials including certain metals. Any suitable conducting material known in the art may be used. In some embodiments, it may be preferred for at least one of the contacts (or both contacts in structures having two contacts as in FIG. 1) to be formed of the same material as the electrically conductive material layer 24. For example, it may be preferable for the contact(s) to comprise gold. Gold may be the major component of the layer (e.g., greater than 50% by weight, greater than 75% by weight, or greater the 90% by weight). In certain embodiments, the layer may consist essentially of gold, meaning that other elements are present (if at all) in amounts that do not materially effect the properties of the layer.

The contacts may also be formed of other suitable metals including titanium, nickel, aluminum, and copper, amongst others. Any alloy combinations of these metals (including gold) may be suitable. In some embodiments, the composition of the contact may depend upon the type of material that the contact is formed on. Suitable metals for n-type contacts include titanium, nickel, aluminum, gold, copper, and alloys thereof. Suitable metals for p-type contacts include nickel, gold, and titanium, and alloys thereof.

The contacts generally have a thickness sufficient to ensure that the contact is electrically conductive across its entire physical area. Suitable thicknesses for contacts, for example, are between about 0.05 microns and about 10 microns.

In some embodiments, structures of the invention may include more than one topside contact and/or more than one or backside contact. In some cases, when backside contacts are present, the structures include no topside contact; and, in some cases, when topside contacts are present, the structures include no backside contacts.

Via 20 can enable formation of a conductive pathway within the structure when electrically conductive material is deposited therein. As shown, the via can connect two or more contacts on various sides of the structure which can lead to greater flexibility in device design, amongst other advantages. However, it should also be understood that not all structures of the invention have a via formed therein.

The via may be formed in any suitable shape. The cross-sectional area of the via is generally sufficient to enable formation of the desired structure (e.g., electrically conductive material layer, barrier material layer) therein. The cross-sectional profile of the via may be square, rectangular, spherical, triangular, or the like. The via may have the same cross-sectional profile throughout the via, or may have a cross-sectional area which changes (e.g., increases, decreases) at any point along the depths of the via. For example, in one embodiment, the via may have a cross-sectional profile which progressively narrows as the depth of the via increases. In some embodiments, a first portion of the via has a relatively large cross-sectional area and a second portion of the via has a smaller cross-sectional area. The first portion may extend from a topside of the structure and is formed in a first etching step; and, the second portion may extend from a backside of the structure and is formed of a second etching step.

The via may extend from different sides of the structure and to a variety of depths in the structure based on the application. The via may extend from the topside 29 and/or backside 31. In some cases, the via extends through the entire structure (e.g., as shown in FIG. 1) and, thus, from both the topside and backside. However, it is also possible for the via to extend from only one of the topside or backside and through only a portion of the structure. For example, the via may extend from the topside to the silicon substrate (particularly, if the silicon substrate is sufficiently conductive and may be grounded). Also, the via may extend from the backside through the silicon substrate to a point within the gallium nitride material region. Other via arrangements are also possible.

In the illustrative embodiment, a portion of the via remains unfilled with material. However, in other cases, the via may be completely filled with material. Also, it should be understood that other layers (in addition to the barrier material layer and the electrically conductive material layer) may be formed in the via.

It should be understood that the electrically conductive material layers and/or the barrier material layers described above may be formed within a portion, or the entire via, in any via arrangement.

In certain preferred embodiments, substrate 14 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used, though single crystal silicon substrates are preferred. In some cases, silicon (111) substrates are preferred. In other cases, silicon (100) substrates are preferred. In some embodiments, silicon substrates having a relatively high resistivity are preferred. For example, in some cases, the silicon substrate has a resistivity of greater than 10 kilo-Ohms.

It should be understood that other types of substrates may also be used including sapphire, silicon carbide, indium phosphide, silicon germanium, gallium arsenide, gallium nitride, aluminum nitride, or other III-V compound substrates. However, in embodiments that do not use silicon substrates, all of the advantages associated with silicon substrates may not be achieved. In some embodiments, it may be preferable to use non-nitride material-based substrates such as silicon, sapphire, silicon carbide, indium phosphide, silicon germanium and gallium arsenide.

Substrate 14 may have any suitable dimensions. Suitable diameters include, but are not limited to, about 2 inches (or 50 mm), 4 inches (or 100 mm), 6 inches (or 150 mm), and 8 inches (or 200 mm). In some embodiments, it may be preferable to use a silicon substrate having relatively large diameters of at least about 4 inches (or 100 mm) or at least about 6 inches (or 150 mm). As described further below, the arrangement of layers between the silicon substrate and the gallium nitride material region (e.g., strain-absorbing layer 12, intermediate layer 15, and transition layer 16) may be designed to enable high quality gallium nitride material to be deposited even at relatively large diameters. In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, in thinner substrates. In other embodiments, thinner substrates (e.g., less than 125 microns) are used, though these embodiments may not have the advantages associated with thicker substrates, but can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). As shown, the layers/regions of the device (e.g., strain-absorbing layer, intermediate layer, transition layer, gallium nitride material region) may also be substantially planar in the final device or structure. As described further below, such layers/regions may be grown in vertical (e.g., non-lateral) growth processes. Planar substrates and layers/regions can be advantageous in some embodiments, for example, to simplify processing. Though it should be understood that, in some embodiments of the invention, lateral growth processes may be used, as described further below, which may use textured substrates.

Strain-absorbing layer 12 helps absorb strain that arises due to lattice differences between the crystal structure of the substrate and the crystal structure of overlying layers (e.g., intermediate layer 15, transition layer 16, gallium nitride material region 18). In the absence of the strain-absorbing layer, this strain is typically accommodated by the generation of misfit dislocations in the layer that forms an interface with the substrate. Thus, by providing an alternative mechanism for accommodating stress, the presence of the strain-absorbing layer may reduce the generation of misfit dislocations. Suitable strain-absorbing layers have been described, for example, in commonly-owned, co-pending U.S. patent application Ser. No. 10/879,703, filed Jun. 28, 2004, which is incorporated herein by reference.

Furthermore, the strain-absorbing layer can help absorb strain that arises due to differences in the thermal expansion rate of the substrate as compared to the thermal expansion rate of overlying layer(s) including the gallium nitride material region. Such differences can lead to formation of defects (e.g., misfit dislocations) at the overlying layer/substrate interface, or cracking in overlying layer(s) including the gallium nitride material region. As described further below, transition layer 16 also helps absorb this thermally-induced strain.

In certain preferred embodiments, strain-absorbing layer 12 is formed of a silicon nitride-based material. Silicon nitride-based materials include any silicon nitride-based compound (e.g., $Si_xN_y$, such as SiN and $Si_3N_4$, SiCN, amongst others) including non-stoichiometric silicon nitride-based compounds. In some embodiments, a SiN strain-absorbing layer may be preferred. Silicon nitride material-based strain-absorbing layers may be particularly preferred when formed directly on a silicon substrate, as described further below.

It should also be understood that it is possible for the strain-absorbing layer to be formed of other types of materials according to other embodiments of the invention. Though all of the advantages associated with silicon nitride-based materials may not be achieved in these embodiments.

In some embodiments, it is preferable for the strain-absorbing layer to have an amorphous (i.e., non-crystalline) crystal structure. Amorphous strain-absorbing layers are particularly effective in accommodating strain and, thus, reducing the generation of misfit dislocations and other types of defects.

However, it should be understood that in certain embodiments of the invention the strain-absorbing layer may have a single crystal or poly-crystalline structure. In these cases, however, all of the advantages associated with the amorphous layer may not be realized.

In some embodiments, it is preferred for the strain-absorbing layer to be very thin, particularly when formed of amorphous and/or silicon nitride-based materials. It has been discovered that very thin strain-absorbing layers (e.g., silicon nitride-based strain-absorbing layers) may enable formation of overlying layer(s) having an epitaxial relationship with the substrate, while also being effective in reducing the number of misfit dislocations. In certain cases (e.g., when the strain-absorbing layer is amorphous), it is desirable for the strain-absorbing layer to have a thickness that is large enough to accommodate sufficient strain associated with lattice and thermal expansion differences between the substrate and overlying layer(s) to reduce generation of misfit dislocations. In these cases, it may also be desirable for the strain-absorbing layer to be thin enough so that the overlying layer(s) have an epitaxial relationship with the substrate. This can be advantageous for formation of a high quality, single crystal gallium nitride material region. If the strain-absorbing layer is too thick, then the overlying layer(s) may not be formed with epitaxial relationship with the substrate.

In some embodiments, the strain-absorbing layer has a thickness of less than about 100 Angstroms which, in these embodiments, can allow the epitaxial relationship between the substrate and the overlying layer. In some embodiments, it may be preferable for the strain-absorbing layer to have a thickness of less than about 50 Angstroms to allow for the epitaxial relationship.

The strain-absorbing layer may have a thickness of greater than about 10 Angstroms which, in these embodiments, is sufficient to accommodate strain (e.g., resulting from lattice and thermal expansion differences) and can facilitate forming a strain-absorbing layer that covers the entire substrate, as described further below. In other embodiments, the strain-absorbing layer may have a thickness of greater than about 20 Angstroms to sufficiently accommodate strain. Suitable thickness ranges for the strain-absorbing layer include all of those defined by the ranges described above (e.g., greater than about 10 Angstroms and less than about 100 Angstroms, greater than about 10 Angstroms and less than about 50 Angstroms, and the like). Also, the strain-absorbing layer thickness may be between about 20 Angstroms and about 70 Angstroms.

It should be understood that suitable thicknesses of the strain-absorbing layer may depend on a number of factors including the composition and crystal structure of the strain-absorbing layer; the composition, thickness and crystal structure of the overlying layer; as well as the composition, thickness, and crystal structure of the substrate, amongst other factors. Suitable thicknesses may be determined by measuring the effect of thickness on misfit dislocation density and other factors (e.g., the ability to deposit an overlying layer having an epitaxial relationship with the substrate, etc.). It is also possible for the strain-absorbing layer to have a thickness outside the above ranges.

As described further below, in some embodiments, the strain-absorbing layer may be formed by nitridating a top surface region of a silicon substrate. That is, the surface region of the substrate may be converted from silicon to a silicon nitride-based material to form the strain-absorbing layer. It should be understood that, as used herein, such strain-absorbing layers may be referred to as being "formed on the substrate", "formed over the substrate", "formed directly on the substrate" and as "covering the substrate". Such phrases also refer to strain-absorbing layers that are formed by depositing a separate layer (e.g., using a separate nitrogen source and silicon source) on the top surface of the substrate and are not formed by converting a surface region of the substrate.

In the illustrative embodiment, the strain-absorbing layer covers substantially the entire top surface of the substrate. This arrangement may be preferable to minimize the number of defects (e.g., misfit dislocations) in the overlying layer(s). In other embodiments, the strain-absorbing layer may cover a majority of the top surface of the substrate (e.g., greater than 50 percent or greater than 75 percent of the top surface area).

The extent that the strain-absorbing layer covers the substrate (and the area between the overlying layer and the substrate) in the present invention may be distinguished from certain prior art techniques in which a discontinuous silicon nitride layer is formed (in some cases, inadvertently) between a silicon substrate and an overlying layer.

It should be understood that, in other embodiments, the strain-absorbing layer may be positioned elsewhere in the structure including between two different layers. In some cases, structures of the invention do not include an intermediate layer.

The structure of FIG. 1 includes an intermediate layer 15 formed of a nitride-based material that overlies the strain-absorbing layer. Suitable nitride-based materials include, but are not limited to, aluminum nitride materials (e.g., aluminum nitride, aluminum nitride alloys) and gallium nitride materials (e.g., gallium nitride, gallium nitride alloys). In some cases, the intermediate layer has a constant composition.

It may be preferable for the intermediate layer to have a single crystal structure. As noted above, in some embodiments, the thickness of the strain-absorbing layer is controlled so that the intermediate layer has an epitaxial relationship with the substrate. It may be advantageous for the intermediate layer to have a single crystal structure because it facilitates formation of a single crystal, high quality gallium nitride material region. In some embodiments, the intermediate layer has a different crystal structure than the substrate.

It should also be understood that the intermediate layer may not have a single crystal structure and may be amorphous or polycrystalline, though all of the advantages associated with the single crystal intermediate layers may not be achieved.

The intermediate layer may have any suitable thickness. For example, the intermediate layer may be between about 10 nanometers and 5 microns, though other thicknesses are also possible.

It should also be understood that not all structures of the invention include an intermediate layer.

In the illustrative embodiment, transition layer 16 is formed directly on the intermediate layer. In certain embodiments, such as when the intermediate layer has a constant composition, it may be preferred for the transition layer to be formed of a compositionally-graded material (e.g., a compositionally-graded nitride-based material). Suitable compositionally-graded layers have been described in commonly-owned U.S. Pat. No. 6,649,287 which is incorporated by reference above. Compositionally-graded transition layers have a composition that is varied across at least a portion of the layer. Compositionally-graded transition layers are particularly effective in reducing crack formation in gallium nitride material regions formed on the transition layer by lowering thermal stresses that result from differences in thermal expansion rates between the gallium nitride material and the substrate (e.g., silicon).

According to one set of embodiments, the transition layer is compositionally-graded and formed of an alloy of gallium nitride such as $Al_xIn_yGa_{(1-x-y)}N$, $Al_xGa_{(1-x)}N$, and $In_yGa_{(1-y)}N$. In these embodiments, the concentration of at least one of the elements (e.g., Ga, Al, In) of the alloy is varied across at least a portion of the thickness of the transition layer. When transition layer 16 has an $Al_xIn_yGa_{(1-x-y)}N$ composition, x and/or y may be varied. When the transition layer has a $Al_xGa_{(1-x)}N$ composition, x may be varied. When the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within gallium nitride material region 18. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In one preferred embodiment, structure 10 includes an aluminum nitride intermediate layer 15 and a compositionally-graded transition layer 16. The compositionally-graded transition layer may have a composition of $Al_xGa_{(1-x)}N$, where x is graded from a value of 1 at the back surface of the transition layer to a value of 0 at the front surface of the transition layer. The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

In some embodiments, the compositionally-graded transition layer comprises a superlattice which, for example, includes alternating layers of nitride-based materials (e.g., gallium nitride material and aluminum nitride material)

It should be understood that, in other cases, transition layer 16 may have a constant composition and may not be compositionally-graded.

The strain-absorbing layer, intermediate layer and transition layer are typically not part of the active region of the device. As described above, these layers may be formed to facilitate deposition of gallium nitride material region 18. However, in some cases, the intermediate layer and/or transition layer may have other functions including functioning as a heat spreading layer that helps remove heat from active regions of the semiconductor structure during operation of a device. For example, such transition layers that function as heat spreading layers have been described in commonly-owned U.S. Pat. No. 6,956,250 which is incorporated herein by reference and is based on U.S. patent application Ser. No. 09/792,409 entitled "Gallium Nitride Materials Including Thermally-Conductive Regions," filed Feb. 23, 2001.

Active regions of the device may be formed in gallium nitride material region 18. Gallium nitride material region 18 comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in U.S. Pat. No. 6,649,287, incorporated by reference above.

In some cases, the gallium nitride material region includes only one gallium nitride material layer. In other cases, the gallium nitride material region includes more than one gallium nitride material layer. For example, the gallium nitride material region may include multiple layers. In certain embodiments, it may be preferable for the gallium nitride material of a first layer to have an aluminum concentration that is greater than the aluminum concentration of the gallium nitride material of a second layer of region 18. For example, the value of x in the gallium nitride material of first layer (with reference to any of the gallium nitride materials described above) may have a value that is between 0.05 and 1.0 greater than the value of x in the gallium nitride material of second layer, or between 0.05 and 0.5 greater than the value of x in the gallium nitride material of the first layer. For example, the second layer may be formed of $Al_{0.26}Ga_{0.74}N$, while the first layer is formed of GaN. This difference in aluminum concentration may lead to formation of a highly conductive region at the interface of the layers (i.e., a 2-D electron gas region). A third layer, for example, may be formed of GaN.

The general semiconductor structure illustrated in FIG. 1 may be incorporated into a variety of semiconductor devices including devices described in commonly-owned U.S. Pat. No. 7,071,498 which is incorporated herein by reference and is based on commonly-owned, co-pending U.S. patent application Ser. No. 10/740,376, filed on Dec. 17, 2003, and entitled "Gallium Nitride Material Devices Including an Electrode-Defining Layer and Methods of Forming the Same". Suitable devices include, but are not limited to, electronic devices including transistors (e.g., FETs), SAW devices, and sensors; as well as, light-emitting devices including LEDs and laser diodes. The devices have active regions that are typically, at least in part, within the gallium nitride material region. Also, the devices include a variety of other functional layers and/or features (e.g., electrodes).

Figure 2:
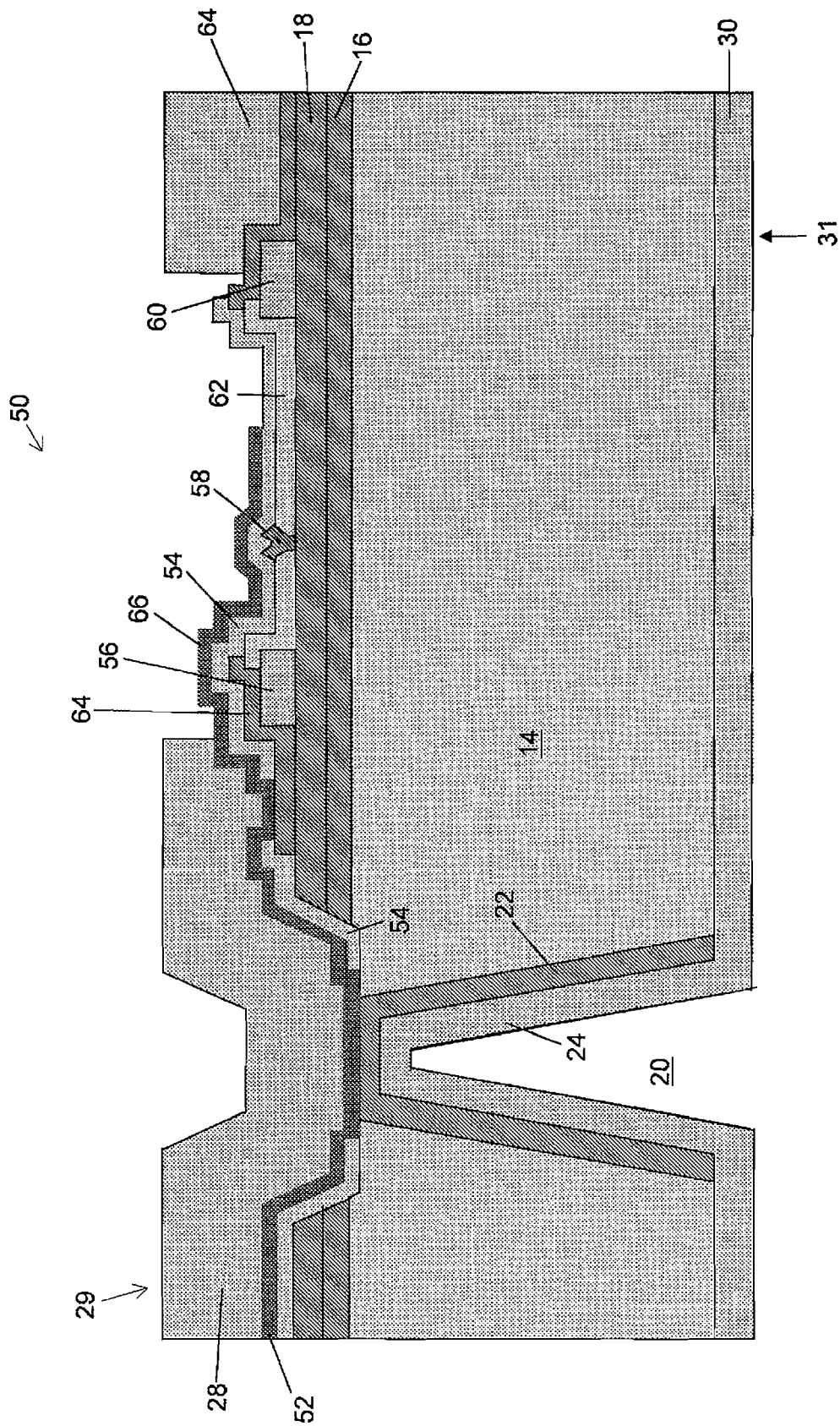
FIG. 2 illustrates a semiconductor device according to an embodiment of the present invention.

FIG. 2 illustrates a semiconductor device 50 according to an embodiment of the invention. In this illustrative embodiment, the semiconductor device is a transistor (e.g., a field effect transistor). The device includes electrically conductive material 24 that extends within via 20 to form at least part of an electrically conductive pathway that connects backside contact 30 to topside contact 28. As shown, the electrically conductive material is formed of the same composition (and, in some cases, in the same processing step) as the backside contact. For example, the electrically conductive material and the backside contact may be a gold-based composition as described above. However, it should be understood that the invention is not limited in this regard and that the electrically conductive material may be formed from a different material than the backside contact.

Barrier material layer 22 separates the electrically conductive material 24 from substrate 14 (e.g., a silicon substrate). In the embodiment of FIG. 2, barrier material layer 22 also forms part of the conductive pathway that connects backside contact 30 to topside contact 28. Thus, in this case, the barrier material layer is formed of a conductive material as described above. In the illustrative embodiment, layer 52 may also form part of the electrically conductive pathway that connects the backside contact to the topside contact. An encapsulating layer 54 may electrically isolate layer 52 from other regions of the device including gallium nitride material layer 18 and transition layer 16. The encapsulating layer may be formed of an insulating material such as an oxide (e.g., silicon oxide) or a nitride (e.g., silicon nitride).

Device 50 includes a source electrode 56, a gate electrode 58 and a drain electrode 60. In this embodiment, the source electrode is electrically connected to the topside contact and to the backside contact through a conductive pathway that includes the electrically conductive material 24.

The gate electrode may be defined, in part, in a via formed in an electrode-defining layer 62. The electrode-defining layer may be a passivating layer and may be formed of a silicon nitride-based material (e.g., $Si_3N_4$). Suitable electrode-defining layers and source-gate-drain arrangements have been described in U.S. Pat. No. 7,071,498 which is incorporated by reference above.

The device may also include a source field plate 66 formed, in part, on the encapsulation layer and is electrically connected to the source electrode. In the illustrative embodiment, the source field plate extends in a direction toward the gate electrode. Suitable source field plates have been described in commonly-owned, co-pending U.S. patent application Ser. No. not yet assigned, filed on Nov. 30, 2006, and entitled "Gallium Nitride Material Devices and Associated Methods" which is incorporated herein by reference.

The device may also include a metal layer 64 which may connect other electrically conductive regions on the device to one another.

In the illustrative embodiment, strain absorbing layer 12 and intermediate layer 15 are not shown, though it should be understood that these layers may also be present. Other variations to the device shown in FIG. 1 are also possible and would be understood by one of ordinary skill in the art.

In some embodiments, the device may be attached to a component such as a package. For example, the device may be bonded to the back surface of the device with a eutectic comprising an electrically conductive material (e.g., gold) and silicon. The bonding process may involve heating the structure to form a liquid eutectic comprising the electrically conductive material and silicon, and cooling the liquid eutectic to form a bond between the semiconductor structure and the component.

Semiconductor structures of the invention may be manufactured using known semiconductor processing techniques. It should be understood that variations to this process are within the scope of the present invention.

The substrates (e.g., silicon) used in accordance with the invention are generally commercially available. In embodiments in which a strain-absorbing layer is a silicon nitride-based material (e.g., amorphous SiN), the strain-absorbing layer may be formed by nitridating a top surface of a silicon substrate as noted above. In a nitridation process, nitrogen reacts with a top surface region of the silicon substrate to form a silicon nitride-based layer. The top surface may be nitridated by exposing the silicon substrate to a gaseous source of nitrogen at elevated temperatures. For example, ammonia may be introduced into a reaction chamber in which a silicon substrate is positioned. The temperature in the reaction chamber may be between about 1000° C. and about 1100° C. and the pressure may be between about 20 torr and about 40 torr (in some cases, about 30 torr). The reaction between nitrogen and the silicon substrate is allowed to proceed for a reaction time selected to produce a layer having a desired thickness.

It should be understood that other processes may be used to form silicon nitride-based strain-absorbing layers including processes (e.g., CVD processes) that use separate nitrogen and silicon sources. Also, when the strain-absorbing layer is formed of another type of material (non-silicon nitride-based material), other deposition processes known in the art are used.

In some embodiments, the strain-absorbing layer may be formed in-situ with certain overlying layers (e.g., the intermediate layer, gallium nitride material region). That is, the strain-absorbing layer may be formed during the same deposition step as the intermediate layer (and, in some cases, subsequent layers). In processes that grow a silicon nitride-based material strain-absorbing layer by introducing a nitrogen source (e.g., ammonia) into a reaction chamber as described above, a second source gas may be introduced into the chamber after a selected time delay after the nitrogen source. The second source reacts with the nitrogen source to form the overlying layer (e.g., intermediate layer), thus, ending growth of the strain-absorbing layer. For example, when the overlying layer (e.g., intermediate layer) is formed of aluminum nitride, an aluminum source (e.g., trimethylaluminum) is introduced into the chamber at a selected time after the nitrogen source (e.g., ammonia). The time delay is selected so that the strain-absorbing layer grows to a desired thickness. The reaction between the second source (e.g., aluminum source) and the nitrogen source is allowed to proceed for a sufficient time to produce the intermediate layer. When the overlying layer (e.g., intermediate layer) has a single crystal structure, the reaction conditions are selected appropriately. For example, the reaction temperature may be greater than 700° C., such as between about 1000° C. and about 1100° C. In some cases, lower growth temperatures may be used including temperatures between about 500° C. and about 600° C.

It should be understood that the strain-absorbing layer may be formed in a separate process than the intermediate layer and subsequent layers. For example, the strain-absorbing layer may be formed on the substrate in a first process. Then, at a later time, the intermediate layers may be formed on the strain-absorbing layer in a second process.

Transition layer 16 and gallium nitride material region 18 may also be grown in the same deposition step as the intermediate layer and the strain-absorbing layer. In such processes, suitable sources are introduced into the reaction chamber at appropriate times. Suitable MOCVD processes to form compositionally-graded transition layers and gallium nitride material region over a silicon substrate have been described in U.S. Pat. No. 6,649,287 incorporated by reference above. When the gallium nitride material region has different layers, in some cases, it is preferable to use a single deposition step to form the entire region. When using the single deposition step, the processing parameters may be suitably changed at the appropriate time to form the different layers.

It should also be understood that the transition layer and the gallium nitride material region may be grown separately from the strain-absorbing layer and intermediate layer. The gallium nitride material region and transition layer may be grown in a vertical growth process. That is, these regions are grown in a vertical direction with respect to underlying layers. The ability to vertically grow the gallium nitride material region having defect densities may be advantageous as compared to lateral growth processes which may be more complicated.

Vias in the devices and structures may be formed using conventional techniques. For example, etching techniques may be used to form vias. In embodiments that include vias that extend through structures, a first portion of the via may be formed in a first etching step and a second portion in a second step.

The conductive and/or metal layers may be formed using suitable conventional techniques including sputtering, electroplating and evaporative techniques. In some embodiments, it may be preferred that the barrier material layers are sputtered. In some embodiments, it may be preferred that the conductive material layer is electroplated (e.g., when the conductive material layer comprises a gold composition as described above). The backside contact and/or the topside contact may also be electroplated (e.g., when the conductive material layer comprises a gold composition as described above). In cases when the backside contact and the conductive material layer are formed of the same composition, it may be preferable that they are formed in the same processing step (e.g., electroplating).

It should also be understood that other processes may be used to form structures and devices of the present invention as known to those of ordinary skill in the art.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of forming a semiconductor device structure comprising:
    forming a gallium nitride material layer on a substrate;
    forming a via that extends through at least a portion of said substrate;
    forming a barrier material layer along sidewalls of said via, said barrier material layer not extending outside of said via;

forming a layer comprising an electrically conductive material on a back surface of said substrate to form a semiconductor structure;

heating said semiconductor structure to form a bond between said semiconductor structure and a component.

2. The method of claim 1, wherein said substrate comprises silicon.

3. The method of claim 1, wherein said electrically conductive material comprises aluminum.

4. The method of claim 1, wherein said electrically conductive material includes a first layer portion comprising gold and a second layer portion having a different composition than said first layer portion.

5. The method of claim 4, wherein said second layer portion comprises aluminum.

6. The method of claim 1, further comprising a passivating layer formed over said gallium nitride material region.

7. The method of claim 1, wherein said semiconductor structure is a transistor and further comprises a source electrode, a drain electrode and a gate electrode, wherein said first electrical contact is electrically connected to said source electrode.

8. The method of claim 7, wherein said gate electrode is defined by an electrode-defining layer comprising silicon nitride.

9. The method of claim 1, further comprising a transition layer formed between said substrate and said gallium nitride material region.

10. The method of claim 9, wherein said transition layer is compositionally-graded.

11. The method of claim 9, further comprising a silicon nitride layer formed between said substrate and said transition layer.

12. A method of forming a semiconductor device comprising:

forming a gallium nitride material layer on a silicon substrate;

forming a via that extends through at least a portion of said silicon substrate;

forming a bather material layer along sidewalls of said via, said barrier material layer not extending outside of said via;

forming a layer comprising an electrically conductive material on a back surface of said silicon substrate to form a semiconductor structure;

heating said semiconductor structure to form a liquid eutectic comprising said electrically conductive material and silicon; and cooling said liquid eutectic to form a bond between said semiconductor structure and a component.

13. The method of claim 12, wherein said electrically conductive material comprises aluminum.

14. The method of claim 12, wherein said electrically conductive material includes a first layer portion comprising gold and a second layer portion having a different composition than said first layer portion.

15. The method of claim 14, wherein said second layer portion comprises aluminum.

16. The method of claim 12, further comprising a passivating layer formed over said gallium nitride material region.

17. The method of claim 12, wherein said semiconductor structure is a transistor and further comprises a source electrode, a drain electrode and a gate electrode, wherein said first electrical contact is electrically connected to said source electrode.

18. The method of claim 17, wherein said gate electrode is defined by an electrode-defining layer comprising silicon nitride.

19. The method of claim 12, further comprising a transition layer formed between said silicon substrate and said gallium nitride material region.

20. The method of claim 19, further comprising a silicon nitride layer formed between said silicon substrate and said transition layer.

* * * * *